(12) United States Patent
Baker

(10) Patent No.: US 7,382,159 B1
(45) Date of Patent: Jun. 3, 2008

(54) HIGH VOLTAGE INPUT BUFFER

(75) Inventor: William G. Baker, North Parramatta (AU)

(73) Assignee: Integrated Device Technology, Inc., San Jose, CA (US)

( * ) Notice: Subject to any disclaimer, the term of this patent is extended or adjusted under 35 U.S.C. 154(b) by 212 days.

(21) Appl. No.: 11/179,071

(22) Filed: Jul. 12, 2005

Related U.S. Application Data

(60) Provisional application No. 60/658,855, filed on Mar. 3, 2005.

(51) Int. Cl.
*H03K 19/094* (2006.01)
*H03K 19/0175* (2006.01)

(52) U.S. Cl. .............................. 326/83; 326/34; 326/68; 326/87

(58) Field of Classification Search .................. 326/31, 326/34, 83, 86, 87
See application file for complete search history.

(56) References Cited

U.S. PATENT DOCUMENTS

| | | | |
|---|---|---|---|
| 5,973,900 A | | 10/1999 | Sher |
| 6,069,515 A | * | 5/2000 | Singh .......................... 327/309 |
| 6,342,996 B1 | * | 1/2002 | Drapkin et al. ............. 361/91.1 |
| 6,943,587 B2 | * | 9/2005 | Joshi et al. .................... 326/80 |
| 7,205,823 B2 | * | 4/2007 | Chen ........................... 327/534 |
| 2006/0119416 A1 | * | 6/2006 | Fung et al. .................. 327/530 |

* cited by examiner

*Primary Examiner*—James Cho
*Assistant Examiner*—Crystal L Hammond
(74) *Attorney, Agent, or Firm*—Kenneth Glass; Glass & Associates

(57) ABSTRACT

An input buffer circuit includes a voltage limiting circuit and a protection circuit coupled between a pull-up component and a pull-down component of a level detecting circuit. The voltage limiting circuit receives an input signal at a first voltage range and limits the input signal to a safe voltage range, the first voltage range being between an electrical ground and a first supply voltage level, and the safe voltage range being between the electrical ground and a second supply voltage level. The level detecting circuit has a pull-up component receiving the input signal directly from the input terminal and a pull-down component receiving the safe voltage range from the voltage limiting circuit. The level detecting circuit transitions the input signal from the first voltage range to the input signal at the second voltage range. The protection circuit is coupled in series between the pull-up component and the pull-down component so as to protect the level detecting circuit from gate oxide overstress.

16 Claims, 4 Drawing Sheets

HIGH VOLTAGE INPUT BUFFER

CROSS REFERENCE TO RELATED APPLICATIONS

This application claims priority to U.S. provisional application Ser. No. 60/658,855 filed Mar. 3, 2005.

FIELD OF THE INVENTION

The present invention relates generally to the field of integrated circuits. More specifically, the present invention relates to input/output (I/O) circuits.

BACKGROUND ART

Input buffer circuits are commonly used in Input/Output (I/O) units of Integrated Circuit (IC) devices for receiving data input signals from external systems. When the received data input signals have a voltage level that is greater than the supply voltage of the integrated circuit device, the input buffer transitions the received data input signals to the supply voltage level of the integrated circuit device. With the ever increasing speed requirements of conventional integrated circuit devices, there has been a corresponding need for high-speed input buffers. In order to increase the speed of input buffer circuits and to lower power consumption IC manufacturers have moved to thin gate oxide fabrication processes. However, the high voltage of the input signal can cause breakdown of the gate oxide. In addition, these input buffer circuits can suffer from duty cycle distortion.

In order to solve these problems, one prior art input buffer uses a NMOS transistor in series with the input terminal to limit the voltage swing at the gate oxide of an input inverter, thus protecting the thin gate oxide of the NMOS pull-down transistor and the PMOS pull-up transistor. To reduce the supply current when the input is high, a pull-up circuit (e.g. PMOS transistor gated by the output) is used to pull up the input of the inverter when the input signal is substantially more than the trigger voltage of the inverter. However, the problem of duty cycle distortion exists in this type of input buffer circuit because the voltage at the node of the pull-up circuit and the input of the inverter is time dependent. In other words, the voltage at the input of the prior art inverter depends on its previous value when the input signal changed states. Furthermore, this type of prior art input buffer circuit may have unwanted DC current flow in to the input terminal when the input signal is transitioning from high to low Thus, there is a need for a high speed input buffer circuit that can tolerate high voltage input signals. Moreover, there is a need for an input buffer that has low power consumption and that does not have duty cycle distortion. The present invention meets the above needs.

SUMMARY OF THE INVENTION

The present invention provides an input buffer circuit that includes a voltage limiting circuit and a protection circuit coupled between a pull-up component and a pull-down component of a level detecting circuit. The voltage limiting circuit receives an input signal at a first voltage range and limits the input signal to a safe voltage range, the first voltage range being between an electrical ground and a first supply voltage level, and the safe voltage range being between the electrical ground and a second supply voltage level. The level detecting circuit has a pull-up component receiving the input signal directly from the input terminal and a pull-down component receiving the safe voltage range from the voltage limiting circuit. The level detecting circuit transitions the input signal from the first voltage range to the input signal at the second voltage range. The protection circuit is coupled in series between the pull-up component and the pull-down component so as to protect the level detecting circuit from gate oxide overstress.

The present invention also provides a method of buffering an input signal having a first voltage range to the same input signal at different voltage range which includes receiving an input signal at the first voltage range, protecting a level detecting circuit using protection circuit coupled between a pull-up component and a pull-down component of the level detecting circuit, and shifting the input signal at the first voltage range to the input signal at the second voltage range using the protected level detecting circuit.

The method and apparatus of the present invention has high speed, low power consumption and can tolerate high voltage input signals. Moreover, the method and apparatus of the present invention has reduced duty cycle distortion. These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
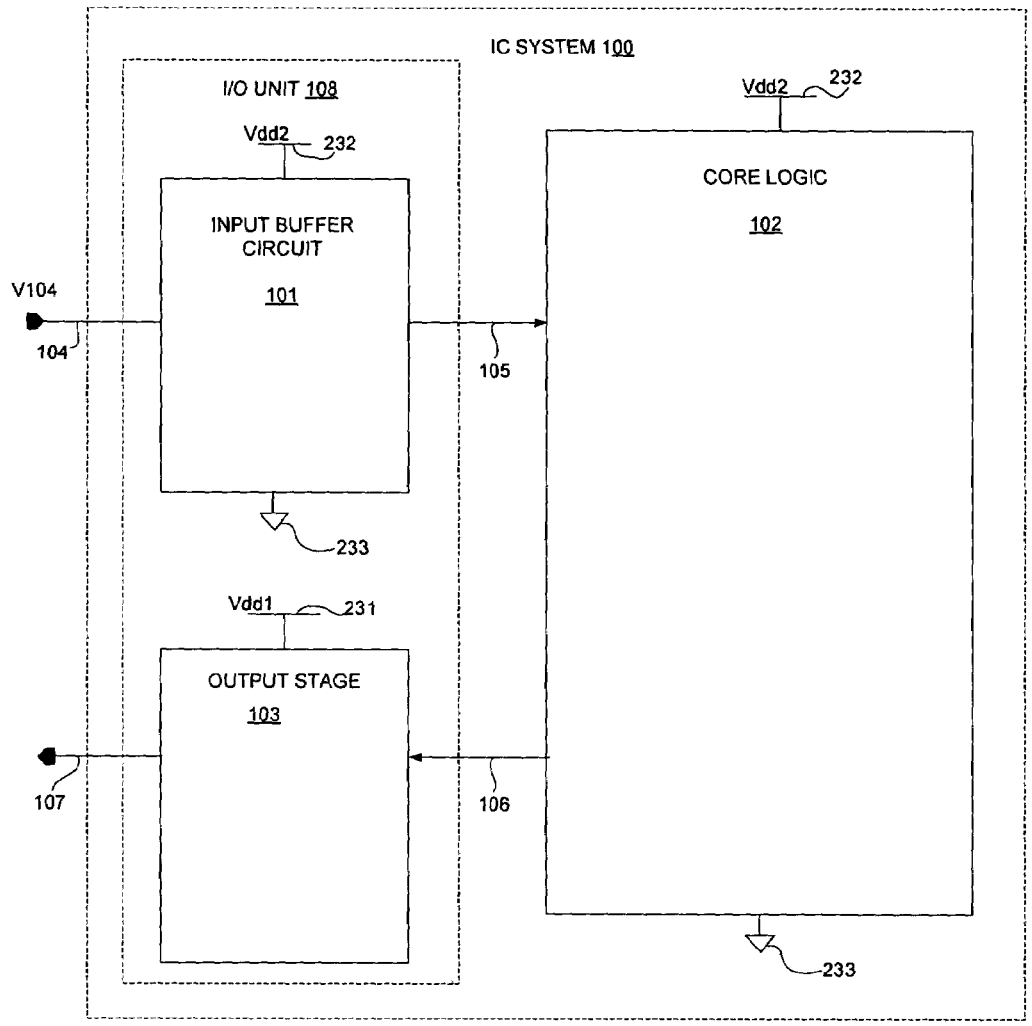
FIG. 1 is an Integrated Circuit (IC) system that includes a high voltage input buffer circuit, core logic, and an output stage in accordance with an embodiment of the present invention.

Referring to FIG. 1 shows an Integrated Circuit (IC) system 100 that includes an Input/Output (I/O) unit 108 that is electrically coupled to a core logic 102. IC system 100 has an input terminal 104 and an output terminal 107. I/O unit 108 includes an input buffer circuit 101 and an output stage 103. In the present embodiment, input buffer circuit 101, core logic 102, and output stage 103 are fabricated using a single thin gate oxide process. Accordingly, all of the transistors in input buffer circuit 101, output stage 103, and core logic 102 have a thin gate oxide. The term "thin gate oxide" as used in the present invention includes devices having a gate oxide thickness of 50 angstroms or less. The term "single thin gate oxide process" includes those semiconductor fabrication processes that form Metal Oxide Semiconductor Field Effect Transistor (MOSFET) devices having a gate oxide thickness that is less than 50 angstroms. The use of thin gate oxide components enables input buffer circuit 101, output stage 103, and core logic 102 to operate at high speed and low power consumption.

Upon receiving an input signal at input terminal 104, input buffer circuit 101 shifts the input signal at a first voltage range to a second voltage range on input signal 105 of core logic 102. The term "first voltage range" includes voltages having a logic low voltage level at an electrical ground 233 and a logic high voltage level at first supply voltage level ($V_{dd1}$) 231. These two logic levels of first voltage range have a voltage variation range. In the present embodiment, the voltage variation range is 0.3 volts [first voltage range=(0 volts+0.3 volts, $V_{dd1}$ volts±0.3 volts)]. The term "second voltage range" includes voltages having a logic low voltage level at an electrical ground 233 of IC system 100 and a logic high voltage level at second supply voltage level ($V_{dd2}$) 232. These two logic levels of second voltage range have a voltage variation range. In the present embodiment, the voltage variation range is 0.3 volts [second voltage range=(0 volts±0.3 volts, $V_{dd2}$ volts±0.3 volts)]. However, it is appreciated that, alternatively, the voltage variation range could be any voltage that is specified in a particular application. Signals at the second voltage range may safely drive core logic 102 operating at second supply voltage level ($V_{dd2}$) 232.

Continuing with FIG. 1, input signal 105 at second voltage range is then transmitted to core logic 102 for signal processing. Core logic 102 operates at second supply voltage level ($V_{dd2}$) 232 that is lower than first supply voltage level ($V_{dd1}$) 231 of input/output (I/O) unit 108 of IC system 100. Accordingly, second supply voltage ($V_{dd2}$) 232 can be referred to as "IC supply voltage", while first supply voltage ($V_{dd1}$) 231 can be referred to as "I/O supply voltage" or "external supply voltage." In one embodiment, IC system 100 is used in Low Voltage Transistor-to-Transistor Logic (LVTTL) applications. The LVTTL standard is a general purpose standard for 3.3 volt applications, 2.5 volt applications, and 1.8 volt applications. In one embodiment of the present invention, first supply voltage level ($V_{dd1}$) 231 is 3.3 volts and second supply voltage level ($V_{dd2}$) 232 is 2.5 volts. Core logic 102 receives input signals at the second voltage range between electrical ground 233 and a second supply voltage level ($V_{dd2}$) 232 (e.g., output signal 105) to perform logic functions and generates output signals 106. Output signal 106 is then shifted back to the first voltage range by output stage 103 and transmitted to external circuits and devices via output terminal 107. In one embodiment of the present invention, input terminal 104 is electrically coupled to output terminal 107 and the operations described above are unchanged.

Figure 2:
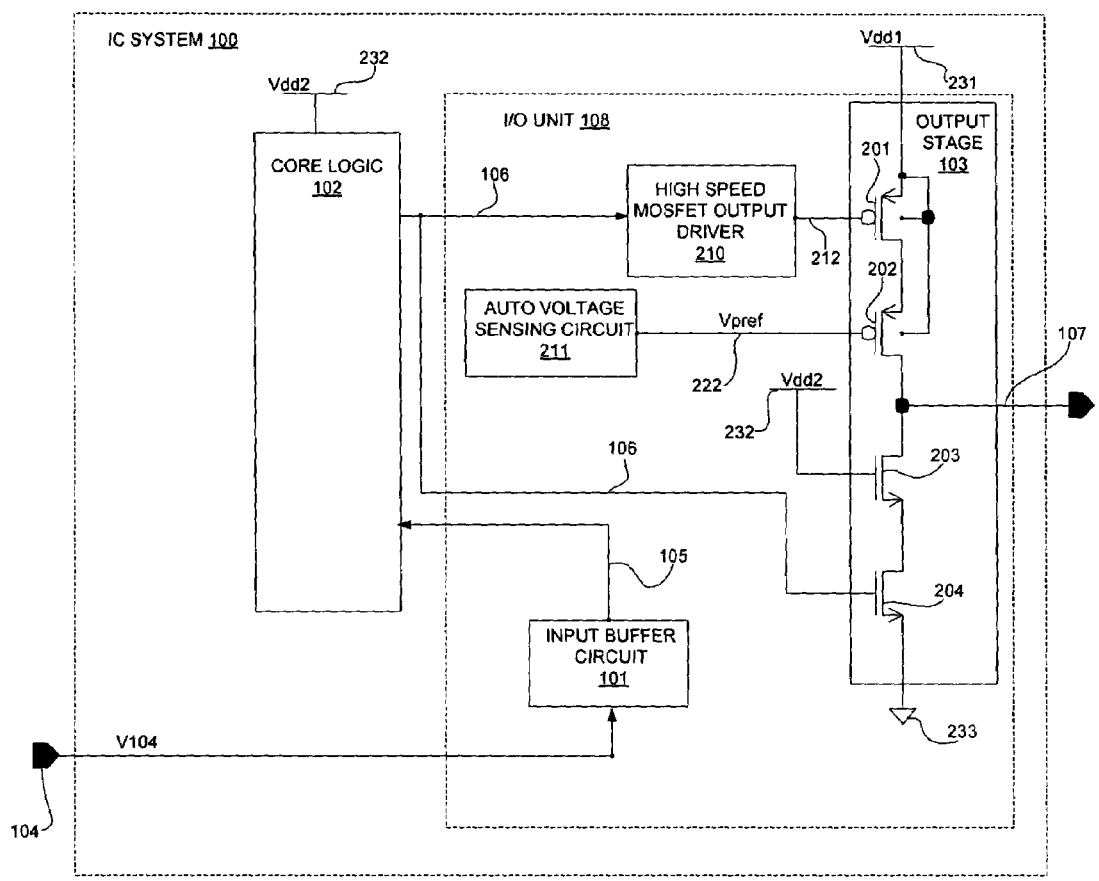
FIG. 2 is a schematic diagram of an output stage used in an IC system of FIG. 1 that includes a high voltage input buffer circuit in accordance with an embodiment of the present invention.

Now referring to FIG. 2, an embodiment of output stage 103 is shown that utilizes the cascode connection of thin gate oxide devices 201-204 to prevent over voltage degradation to thin gate oxide devices 201-204. Output stage 103 receives an output signal 212 from a high speed MOSFET output driver 210 to generate output voltage at output terminal 107. High speed MOSFET output driver 210 receives output signal 106 from core logic 102 and shifts this signal to first voltage range.

Continuing with FIG. 2, output stage 103 is configured as an inverter that includes two PMOS transistors 201 and 202 that are electrically coupled in cascode, and two NMOS transistors 203 and 204 that are electrically coupled in cascode. PMOS transistor 202 reduces the voltage swing at the drain of PMOS transistor 201, reducing the likelihood of damage to the gate oxide of PMOS transistor 201 that can result from over voltage breakdown. The gate of PMOS transistor 201 is electrically coupled to output signal 212 of high speed MOSFET output driver 210. The source of PMOS transistor 201 is electrically coupled to first supply voltage level ($V_{dd1}$) 231. The drain of PMOS transistor 201 is electrically coupled to the source of PMOS transistor 202. The drain of PMOS transistor 202 is electrically coupled to the drain of NMOS transistor 203 to form an output terminal 107 of IC system 100. The gate of PMOS transistor 202 is electrically coupled to an auto voltage sensing circuit 211. Auto voltage sensing circuit 211 generates a reference voltage ($V_{pref}$) 222. In one embodiment, auto voltage sensing circuit 211 automatically senses the difference between first supply voltage level ($V_{dd1}$) 231 and second supply voltage level ($V_{dd2}$) 232 ($V_{pref}=V_{dd1}-V_{dd2}$). The gate of NMOS transistor 203 is electrically coupled to second supply voltage level ($V_{dd2}$) 232. The source of NMOS transistor 203 is electrically coupled to the drain of NMOS transistor 204. The gate of NMOS transistor 204 is electrically coupled to output signal 106 of core logic 102. The source of NMOS transistor 204 is electrically coupled to electrical ground 233. NMOS transistor 203 reduces the voltage swing at the drain of NMOS transistor 204, reducing the likelihood of damage to the gate oxide of NMOS transistor 204 that can result from over voltage breakdown.

In operation, when high speed MOSFET output driver 210 produces logic high, PMOS transistor 201 is off. The drain source voltage of PMOS transistor 201 is limited to $V_{dd2}-(V_{pref}+V_{thp})$, where $V_{thp}$ is the threshold voltage of cascode PMOS transistor 202. This is because PMOS transistor 202 receives reference voltage ($V_{pref}$) 222 from auto voltage sensing circuit 211 at its gate. When the voltage at the source of PMOS transistor 202 drops to the limiting voltage which is the sum of reference voltage ($V_{pref}$) 222 and $V_{thp}$($V_{pref}+V_{thp}$), PMOS transistor 202 turns off, preventing the source voltage from falling below the limiting voltage ($V_{pref}+V_{thp}$). Thus, cascode PMOS transistor 202 limits the voltage seen by PMOS transistor 201 between first supply voltage level ($V_{dd1}$) 231 and the limiting voltage ($V_{pref}+V_{thp}$). For example, if first supply voltage level ($V_{dd1}$) 231 is 3.3 volts and the reference voltage ($V_{pref}$) 222 is 0.8 volts, and the threshold voltage of PMOS transistor 202 is 0.6 volts, and the output terminal 107 is at 0.0 volts, then the drain source voltage seen by pull-up PMOS transistor 201 is 1.9 volts (3.3 volts−(0.8 volts+0.6 volts)) instead of the full 3.3 volts (3.3 volts−0.0 volts), protecting thin gate oxide devices 201-202 in output stage 103.

When output voltage 106 of core logic 102 is low, high speed MOSFET output driver 210 produces a logic low level at output signal 212, which turns on PMOS transistor 201. PMOS transistor 201 pulls its drain to the first supply voltage ($V_{dd1}$) 231. PMOS transistor 202 turns on and pulls output terminal 107 to the first supply voltage ($V_{dd1}$) 231. Because output signal 106 of core logic 102 is low, NMOS transistor 204 is off. NMOS transistor 203 pulls its source up to the second supply voltage ($V_{dd2}$) 232 minus the threshold voltage of NMOS transistor 203 ($V_{dd2}-V_{thp}$). Thus, NMOS transistor 203 limits the drain source voltage of NMOS transistor 204.

Figure 3:
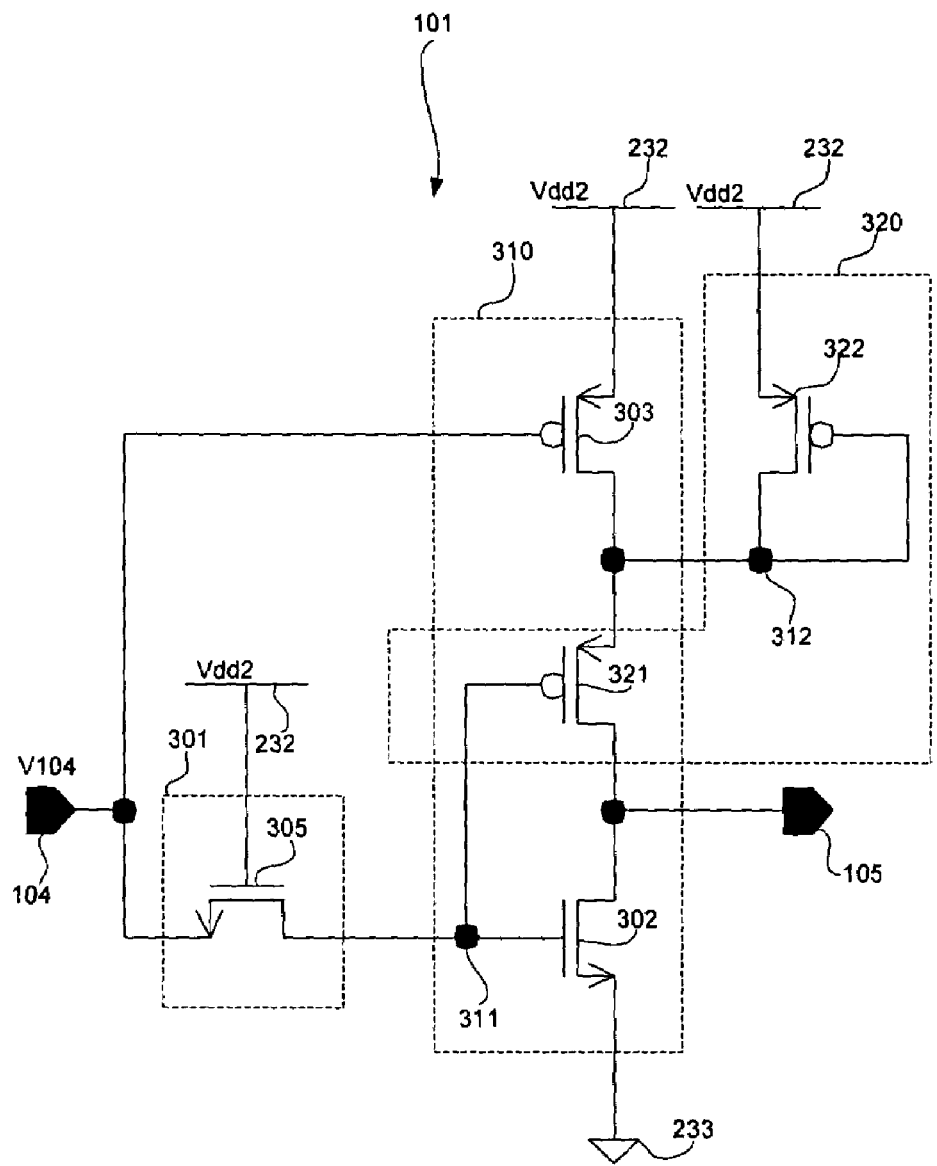
FIG. 3 is a schematic diagram that illustrates a high voltage input buffer circuit that is used in IC device of FIG. 1 in accordance with an embodiment of the present invention.

Now referring to FIG. 3, an embodiment of high voltage input buffer circuit 101 is shown that includes a protection circuit that is coupled to a level detecting circuit. The level detecting circuit is configured to receive input signals directly from input terminal 104. Input buffer circuit 101 interfaces with high voltages on input terminal 104 even though it is manufactured using a single thin gate oxide low process. The low voltage process allows higher speeds to be obtained. In addition, the input buffer circuit 101 produces low Direct Current (DC input) current and low power consumption when input signals are at the Complementary Metal Oxide Semiconductor (CMOS) levels (e.g., either at logic high or logic low).

Referring to FIG. 3, input buffer circuit 101 includes a voltage limiting circuit 301, a level detecting circuit 310, and protection circuit 320. Voltage limiting circuit 301 receives an input signal at a first voltage range and limits the input signal to a safe voltage level at an input node 311. Level detecting circuit 310 includes a pull-up component and a pull-down component. In the present embodiment, the pull-up component is a PMOS transistor 303 and the pull-down component is an NMOS transistor 302. However, it is appreciated that, alternatively, the pull-up component could include more than one PMOS transistor and the pull-down component could include more than one NMOS transistor. PMOS transistor 303 is electrically coupled to input terminal 104. Upon receiving an input signal from the input terminal 104, level detecting circuit 310 detects and transitions the input signal to the same input signal at second voltage range. More particularly, in the present embodiment, whenever the input signal at input node 311 is lower than the trigger voltage level of level detecting circuit 310, level detecting circuit 310 shifts input signal to second supply voltage level ($V_{dd2}$) 232. For minimum duty cycle distortion, the trigger voltage level of level detecting circuit 310 is half way between minimum input voltage high (min VIH) and maximum input voltage low (max VIL). Protection circuit 320 is coupled between pull-up component 303 and pull-down component 302 of level detecting circuit 310 for protecting PMOS transistor 303 of the level detecting circuit 310.

Continuing with FIG. 3, voltage limiting circuit 301 is used to limit the input voltage seen by level detecting circuit 310 at input node 311. In one embodiment of the present invention, voltage limiting circuit 301 is an NMOS transistor 305. The gate of said NMOS transistor 305 is electrically coupled to second supply voltage level ($V_{dd2}$) 232. The source of NMOS transistor 305 is electrically coupled to input terminal 104. The drain of NMOS transistor 305 is electrically coupled to level detecting circuit 310 and protection circuit 320 at input node 311. Voltage limiting circuit 301 limits the maximum voltage at input node 311 to the difference between the gate voltage (e.g., $V_{dd2}$) of NMOS transistor 301 and its threshold voltage ($V_{thn}$), or $V_{dd2}-V_{thn}$. When the input signal at input terminal 104 is higher than $V_{dd2}-V_{thn}$, NMOS transistor 305 stops conducting. Accordingly, the voltage at input node 311 is limited to a voltage level of $V_{dd2}-V_{thn}$. NMOS transistor 305 ensures that input node 311 does not rise in voltage above a safe voltage level ($V_{dd2}-V_{thn}$) that can detrimentally stress the gate oxide of NMOS transistor 302 and PMOS transistor 321.

Referring to FIG. 3, in the present embodiment, level detecting circuit 310 is a Complementary Metal Oxide Semiconductor (CMOS) inverter that includes PMOS transistor 303 and NMOS transistor 302. The source of PMOS transistor 303 is electrically coupled to second supply voltage level ($V_{dd2}$) 232. The drain of PMOS transistor 303 is electrically coupled to protection circuit 320 and the gate is electrically coupled to the input terminal 104. The gate of NMOS transistor 302 is electrically coupled to the drain of NMOS transistor 305 at input node 311. The source of NMOS transistor 302 is electrically coupled to an electrical ground 233. The drain of said NMOS transistor 302 is electrically coupled to protection circuit 320 to form output terminal 105.

Continuing with FIG. 3, protection circuit 320 is electrically coupled between PMOS transistor 303 and NMOS transistor 302. In the present embodiment, protection circuit 320 includes a first PMOS transistor 321 and a second PMOS transistor 322. First PMOS transistor 321 is coupled between PMOS transistor 303 and NMOS transistor 302. The gate of first PMOS transistor 321 is electrically coupled to of the gate of NMOS transistor 302 and to the drain of NMOS transistor 305 at input node 311. The drain of first PMOS transistor 321 is electrically coupled to the drain of NMOS transistor 302 to form output terminal 105. The source of first PMOS transistor 321 is electrically coupled to the drain of PMOS transistor 303 at a node 312. The gate of second PMOS transistor 322 is electrically coupled to its drain to form a diode. The gate-drain of second PMOS transistor 322 is electrically coupled to the source of first PMOS transistor 321 and to the drain of PMOS transistor 303 at node 312. The source of second PMOS transistor 322 is electrically coupled to second supply voltage level ($V_{dd2}$) 232. In the present embodiment, the dimensions of PMOS transistor 321 and PMOS transistor 303 are matched during the fabrication process. When Metal Oxide Semiconductor (MOS) transistors are matched, their ratios of channel width over channel length (W/L) are approximately equal. In one embodiment, protection circuit 320 includes only first PMOS transistor 321.

In operation, when the voltage of input terminal 104 ($V_{104}$) is at or below ground, PMOS transistor 303 pulls node 312 up to the second supply voltage level ($V_{dd2}$) 232. NMOS transistor 305 pulls input node 311 to $V_{104}$. NMOS transistor 302 is thus off, and PMOS transistor 321 is thus on. PMOS transistor 321 pulls output terminal 105 to second supply voltage level ($V_{dd2}$) 232. When the voltage of input terminal 104 ($V_{104}$) is at second supply voltage level ($V_{dd2}$) 232, PMOS transistor 303 is off. NMOS transistor 305 will pull input node 311 up to second supply voltage level ($V_{dd2}$) 232 minus the threshold voltage of NMOS transistor 305 ($V_{dd2}-V_{thn}$). NMOS transistor 302 is on and pulls output terminal 105 to electrical ground 233. If PMOS transistor 321 is on, it will pull node 312 down to the voltage on input node 311 plus the threshold voltage of PMOS transistor 321 ($V_{thp}$), then PMOS transistor 321 will turn off. With both PMOS transistor 303 off and PMOS transistor 321 off, node 312 is floating and could leak low, for example due to sub-threshold conduction of PMOS transistor 321. If node 312 floats down to the second supply voltage level ($V_{dd2}$) 232 minus the threshold voltage of PMOS transistor 322

($V_{dd2}-V_{thp}$), then PMOS transistor 322 will turn on and prevent node 312 from falling any further.

When the voltage at input terminal 104 ($V_{104}$) is at a voltage above second supply voltage level ($V_{dd2}$) 232, for example when it is at first supply voltage level ($V_{dd1}$) 231, voltage limiting circuit 301 limits the maximum voltage on input node 311 to second supply voltage level ($V_{dd2}$) 232 minus the threshold voltage of NMOS transistor 305 ($V_{dd2}-V_{thn}$). Thus voltage limiting circuit 301 protects NMOS transistor 302 by limiting its gate source voltage to a voltage level of $V_{dd2}-V_{thn}$ or less, and protects PMOS transistor 321 by limiting its gate drain voltage to second supply voltage level ($V_{dd2}$) 232 or less. Ignoring leakage, protection circuit 320 limits the minimum voltage on node 312 to the voltage on input node 311 plus the threshold voltage of PMOS transistor 321 ($V_{thp}$), that is to say the minimum voltage on node 312 is at $V_{dd2}+V_{thp}-V_{thn}$. With leakage, protection circuit 320 limits the minimum voltage on node 312 to a voltage level of $V_{dd2}-V_{thp}$. Thus protection circuit 320 protects PMOS transistor 303 by limiting its gate drain voltage to the voltage of input terminal 104 ($V_{104}$) minus $V_{dd2}-V_{thp}$. If the maximum voltage across the gate insulator is $V_{max}$, then the maximum safe input voltage $V_{104}$ is at a voltage level of $V_{max}+V_{dd2}-V_{thp}$.

When voltage of input terminal 104 ($V_{104}$) is at between second supply voltage level ($V_{dd2}$) 232 and electrical ground 233, the voltage on input node 311 will follow $V_{104}$, up to a maximum voltage level of $V_{dd2}-V_{thn}$. When input node 311 has the same voltage as that of input terminal 104, NMOS transistor 302 PMOS transistor 321 and PMOS transistor 303 behave as an inverter driving output terminal 105. The input threshold voltage at which the output changes from high to low will depend upon the threshold voltages, widths and lengths of these three devices. When $V_{104}$ is close to this input threshold voltage, node 312 will be pulled towards ground by the series combination of NMOS transistor 302 and PMOS transistor 321, but this will not stress the transistors as $V_{104}$ will be less than second supply voltage level ($V_{dd2}$) 232.

In 3.3 volt Low Voltage Transistor-to-Transistor Logic (LVTTL) applications, the input signal can swing from −0.3 volts to 3.9 volts, where 0.3 volts is the voltage variation range. Without protection circuit 320, when the input signal is at high level 3.9 volts, NMOS transistor 302 will pull output terminal 105 to ground, thus PMOS transistor 303 would have a gate drain voltage of 3.9 volts, which would be a substantial stress to the gate oxide. If second supply voltage level ($V_{dd2}$) 232 is 2.5 volts, and the threshold voltage level of PMOS transistor ($V_{thp}$) is 0.6 volts, then protection circuit 320 will limit the gate drain voltage of PMOS transistor 303 to 2.0 volts.

Continuing with FIG. 3, input buffer circuit 101 also works when the voltage of input terminal ($V_{104}$) 104 is equal to second supply voltage level ($V_{dd2}$) 232. In this case, NMOS transistor 305 is off, and NMOS transistor 302 is on. PMOS transistor 321 of protection circuit 320 is off. PMOS transistor 303 is off because it receives second supply voltage ($V_{dd2}$) 232 at its gate. PMOS transistors 303 and 321 are off, and NMOS transistor 302 pulls the voltage at output terminal 105 to electrical ground 233.

Input buffer circuit 101 of the present invention is configured to eliminate the need for a pull-up circuit required by prior art input buffer circuits. Accordingly, input buffer circuit 101 does not suffer from DC current problems caused by the pull-up circuit used in prior art. As such, input buffer circuit 101 has low DC current leakage and low power consumption.

Figure 4:
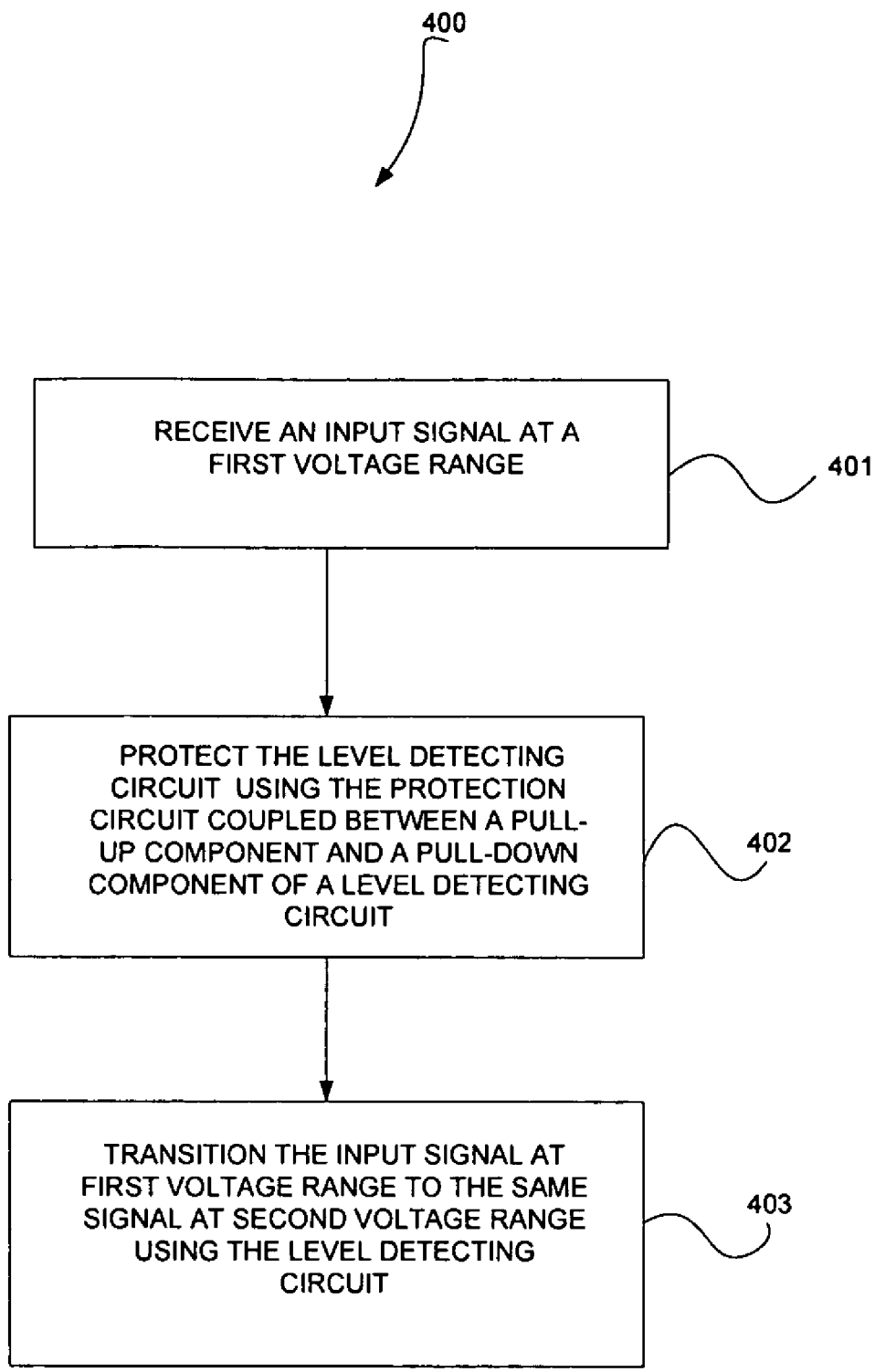
FIG. 4 is a flow chart that illustrates a method of buffering an input signal at a first supply voltage level to an output signal at a second voltage level.

Now referring to FIG. 4, a method 400 for buffering an input signal includes the steps of receiving an input signal at a first voltage range, protecting the level detecting circuit using a protection circuit coupled between a pull-up component and a pull-down component of a level detecting circuit, and shifting the input signal at the first voltage range to the input signal a second voltage range using the level detection circuit.

Referring to step 401, an input signal is received from an external IC system at a first voltage range. In the embodiments shown in FIGS. 1-3, the input signal is received at input terminal 104 of input buffer 101. In one embodiment of the present invention, external IC system (not shown) and IC system 100 use 3.3 volt Low Voltage Transistor-to-Transistor Logic (LVTTL) standards. The first supply voltage ($V_{dd1}$) 231 of external IC system is at 3.3 volts and the second supply voltage level ($V_{dd2}$) 232 of IC system 100 is at 2.5 volts. However, it is understood that IC system 100 and input buffer circuit 101 can use any supply voltage levels. The most commonly used supply voltages are 5 volts in Transistor-to-Transistor Logic (TTL), 3.3 volts and 2.5 volts in LVTTL, Low Voltage Positive Emitter Coupled Logic (LVPECL), and 1.8 volts in High Speed Transceiver Logic (HSTL).

Referring to step 402, the level detecting circuit is protected by using a protection circuit coupled between a pull-up component and a pull-down component of a level detecting circuit. The use of protection circuitry 320 with level detection circuit 310 provides protection to level detecting circuit 310 by limiting the voltage swing at the drain of PMOS transistor 303 to the voltage clamp at node 312, which is $V_{dd2}-V_{thn}+V_{thp}$. In one embodiment, step 402 is implemented by furthering including NMOS transistor 305 to reduce the voltage at input node 311 seen by the gate of NMOS transistor 302. In the case of overshoot, or when input signal is substantially larger than the limiting voltage at input node 311 ($V_{dd2}-V_{thn}$), NMOS transistor 305 stops conducting and thus protects NMOS transistor 302.

Referring to step 403, input signal at first voltage range is shifted to the same input signal at a second voltage range. The term "first voltage range" includes voltages having a logic low voltage level at an electrical ground 233 of IC system 100 and a logic high voltage level at first supply voltage level ($V_{dd1}$) 231. These two logic levels of first voltage range have a voltage variation range. In the present embodiment, the tolerance range is 0.3 volts [first voltage range=(0 volts+0.3 volts, $V_{dd1}$ volts±0.3 volts)]. The term "second voltage range" includes voltages having a logic low voltage level at an electrical ground 233 of IC system 100 and a logic high voltage level at second supply voltage level ($V_{dd2}$) 232. These two logic levels of second voltage range have a tolerance range. In the present embodiment, the voltage variation range is 0.3 volts [second voltage range=(0 volts±0.3 volts, $V_{dd2}$ volts±0.3 volts)]. However, it is appreciated that, alternatively, the voltage variation range could be any voltage that is specified in a particular application. Referring again to FIG. 3, when input signal at input terminal 104 is at logic high or at first supply voltage level ($V_{dd1}$) 231, the voltage at input node 311 is the difference between the second supply voltage level ($V_{dd2}$) and the threshold voltage of NMOS transistor 301, or ($V_{dd2}-V_{thn}$). NMOS transistor 302 having its gate coupled to input node 311 turns on, pulling output signal at output terminal 105 to electrical ground 233. PMOS transistor 303 and first PMOS transistor 321 are off because of logic high voltage at their gates. When input voltage is at logic low, NMOS transistor 302 turns off. PMOS transistor 303 and first PMOS transistor 321 are on and pull the output signal at output terminal 105 to second supply voltage level ($V_{dd2}$) 232. Thus, at step 403, input signal at voltage range is shifted to the same input signal at second voltage range used by core logic 102 of IC system 100.

The present embodiment of the present invention is thus described. While the present invention has been described in particular embodiments, it should be appreciated that the present invention should not be construed as limited by such embodiments, but rather construed according to the following claims.

What is claimed is:

1. An input buffer circuit having an input terminal and an output terminal, comprising:
   a voltage limiting circuit operable to receive an input signal at a first voltage range and to limit the input signal to a safe voltage range, wherein the first voltage range is between a first supply voltage level and an electrical ground;
   a level detecting circuit having a pull-down component electrically coupled to the voltage limiting circuit for receiving the safe voltage level and a pull-up component electrically coupled to the input terminal for receiving the input signal to transition the input signal to the input signal at a second voltage range, wherein the second voltage range is between a second supply voltage level and the electrical ground; and
   a protection circuit comprising a first PMOS transistor electrically coupled between the pull-up component and the pull-down component of the voltage level detecting circuit, a gate of the first PMOS transistor electrically coupled to the level detecting circuit and the pull-down component, a drain of the first PMOS transistor electrically coupled to the output terminal, a source of the first PMOS transistor electrically coupled to the pull-up component of the level detecting circuit, a second PMOS transistor, a gate of the second PMOS transistor electrically coupled to a drain of the second PMOS transistor and to the source of the first PMOS transistor, a source of the second PMOS transistor electrically coupled to the second supply voltage level.

2. The input buffer circuit of claim 1 wherein the voltage limiting circuit further comprises an NMOS transistor, a gate of the NMOS transistor electrically coupled to the second supply voltage level, a source of the NMOS transistor electrically coupled to the input terminal, a drain of the NMOS transistor electrically coupled to the level detecting circuit and the protection circuit.

3. The input buffer circuit of claim 1 wherein the pull-up components further comprise a PMOS transistor, a source of the PMOS transistor electrically coupled to the second supply voltage level, a drain of the PMOS transistor electrically coupled to the protection circuit, a gate of the PMOS transistor electrically coupled to the input terminal; wherein the pull-down component further comprises an NMOS transistor, a gate of the NMOS transistor electrically coupled to the voltage limiting circuit and the protection circuit, a source of the NMOS transistor electrically coupled to the electrical ground, a drain of the NMOS transistor electrically coupled to the protection circuit to form the output terminal.

4. The input buffer circuit of claim 1 wherein the first supply voltage level is greater than the second supply voltage level.

5. The input buffer circuit of claim 1 wherein all of the transistors of the voltage limiting circuit, the protection circuit, and the level detecting circuit have thin gate oxide.

6. The input buffer circuit of claim 1 wherein the first supply voltage level and the second voltage supply level are within Low Voltage Transistor-to-Transistor Logic (LVTTL) standards.

7. An Integrated Circuit (IC) system having an input terminal and an output terminal, comprising:
   an input buffer circuit that includes a voltage limiting circuit, a level detecting circuit and a protection circuit, the voltage limiting circuit operable to receive an input signal at a first voltage range so as to limit the input signal to a safe voltage range, the level detecting circuit having a pull-down component electrically coupled to the voltage limiting circuit for receiving the safe voltage level and a pull-up component electrically coupled to the input terminal for receiving the input signal to transition the input signal to the input signal at a second voltage range, and the protection circuit, electrically coupled between the pull-up component and the pull-down component, the protection circuit comprising a first PMOS transistor electrically coupled between the pull-up component and the pull-down component of the voltage level detecting circuit, a gate of the first PMOS transistor electrically coupled to the level detecting circuit and the pull-down component, a drain of the first PMOS transistor electrically coupled to the output terminal, a source of the first PMOS transistor electrically coupled to the pull-up component of the level detecting circuit, a second PMOS transistor, a gate of the second PMOS transistor electrically coupled to a drain of the second PMOS transistor and to the source of the first PMOS transistor, a source of the second PMOS transistor electrically coupled to the second supply voltage level; the first voltage range being between a first supply voltage level and an electrical ground and the second voltage range being between a second supply voltage level and the electrical ground;
   a core logic operable to receive the input signal at the second supply voltage level from the input buffer circuit to perform a logic function so as to generate a corresponding output signal;
   an output stage electrically coupled to the core logic, operable to receive the output signal and transmit the output signal to the output terminal of the IC system.

8. The IC system of claim 7 wherein the output stage is a high voltage cascode output buffer, the high voltage cascode output buffer further comprising:
   a first PMOS transistor, a second PMOS transistor, a first NMOS transistor, and a second NMOS transistor, a source of the first PMOS transistor electrically coupled to the first supply voltage level, a gate of the first PMOS transistor electrically coupled to a high speed MOSFET output driver, a drain of the first PMOS transistor electrically coupled to a source of the second PMOS transistor, a gate of the second PMOS transistor electrically coupled to an auto voltage sensing circuit, a drain of the second PMOS transistor electrically coupled to a drain of the first NMOS transistor to form an output terminal of said IC device, a gate of the first NMOS transistor electrically coupled to the second supply voltage level, a source of the first NMOS transistor electrically coupled to a drain of the second NMOS transistor, a gate of the second NMOS transistor electrically coupled to the input buffer circuit, and a source of the second NMOS transistor electrically coupled to the electrical ground.

9. The IC system of claim 7 wherein the auto voltage sensing circuit generates a reference voltage proportional to the difference between the first supply voltage level and the second supply voltage level.

10. The IC system of claim 7 wherein the high speed MOSFET output driver is electrically coupled to the core logic for receiving an output signal at the second supply voltage level, the high speed MOSFET output driver operable to transition the output signal at the second supply voltage level to the output signal at the first supply voltage level.

11. A method for buffering an input signal at a first voltage range to an input signal at a second voltage range, comprising:

receiving an input signal at a first voltage range;

protecting a level detecting circuit using a protection circuit electrically coupled between a pull-up component and a pull-down component of the level detecting circuit, the level detecting circuit having a gate coupled directly to the input terminal, and the protection circuit comprising a first PMOS transistor electrically coupled between the pull-up component and the pull-down component of the voltage level detecting circuit, a gate of the first PMOS transistor electrically coupled to the level detecting circuit and the pull-down component, a drain of the first PMOS transistor electrically coupled to the output terminal, a source of the first PMOS transistor electrically coupled to the pull-up component of the level detecting circuit, a second PMOS transistor, a gate of the second PMOS transistor electrically coupled to a drain of the second PMOS transistor and to the source of the first PMOS transistor, a source of the second PMOS transistor electrically coupled to the second supply voltage level; and shifting the input signal at the first voltage range to an output signal at a second voltage range using the level detecting circuit.

12. The method of claim 11 further comprising:
reducing the input signal to a safe voltage range; and
protecting a pull-down component of the level detecting circuit.

13. The method of claim 11 further comprising transmitting the output signal at the second voltage range to an external system.

14. An input buffer circuit for shifting an input signal at a first voltage range to an output signal at a second voltage range, comprising:

means for receiving the input signal at the first voltage range;

level shifting means electrically coupled to the receiving means for shifting the input signal at the first voltage range to the input signal at the second voltage range; and protecting means electrically coupled in series to protect the level shifting means, the protecting means comprising a first PMOS transistor electrically coupled between the pull-up component and the pull-down component of the voltage level detecting circuit, a gate of the first PMOS transistor electrically coupled to the level detecting circuit and the pull-down component, a drain of the first PMOS transistor electrically coupled to the output terminal, a source of the first PMOS transistor electrically coupled to the pull-up component of the level detecting circuit, a second PMOS transistor, a gate of the second PMOS transistor electrically coupled to a drain of the second PMOS transistor and to the source of the first PMOS transistor, a source of the second PMOS transistor electrically coupled to the second supply voltage level.

15. The input buffer circuit of claim 14 wherein the receiving means further comprises means, electrically coupled to the input terminal and the level shifting means, for reducing the input signal to a limiting voltage and for protecting the level shifting means.

16. The input buffer of claim 14 wherein the level shifting means further comprising pull-up means electrically couple to receive the input signal from the input terminal and pull-down means electrically coupled to the receiving means.

* * * * *

UNITED STATES PATENT AND TRADEMARK OFFICE
CERTIFICATE OF CORRECTION

PATENT NO. : 7,382,159 B1 Page 1 of 1
APPLICATION NO. : 11/179071
DATED : June 3, 2008
INVENTOR(S) : Baker It is certified that error appears in the above-identified patent and that said Letters Patent is hereby corrected as shown below:

Column 3, line 33 the phrase "volts + 0.3" should read --volts ± 0.3--.

Column 8, line 47 the phrase "volts + 0.3" should read --volts ± 0.3--.

Signed and Sealed this

Seventh Day of October, 2008

JON W. DUDAS
*Director of the United States Patent and Trademark Office*